United States Patent [19]

Stampfli

[11] Patent Number: 5,023,751
[45] Date of Patent: Jun. 11, 1991

[54] METHOD OF PRODUCING A TAPE FOR PROVIDING ELECTRONIC MODULES, AND TAPE OBTAINED BY THIS METHOD

[75] Inventor: Jean-Marcel Stampfli, Le Landeron, Switzerland

[73] Assignee: ETA SA Fabriques d'Ebauches, Switzerland

[21] Appl. No.: 328,252
[22] PCT Filed: Jun. 6, 1988
[86] PCT No.: PCT/CH88/00102
§ 371 Date: Feb. 3, 1989
§ 102(e) Date: Feb. 3, 1989
[87] PCT Pub. No.: WO88/10509
PCT Pub. Date: Dec. 29, 1988

[30] Foreign Application Priority Data
Jun. 22, 1987 [FR] France .................................. 87 08790

[51] Int. Cl.⁵ .............................................. B32B 31/18
[52] U.S. Cl. ..................................... 361/398; 156/250; 156/252; 156/253; 156/267; 29/825; 29/831; 29/846; 29/847
[58] Field of Search ............... 156/250, 252, 253, 256, 156/267; 29/825, 831, 846, 847, DIG. 37; 361/398, 400, 403, 412, 417, 418, 419, 420, 421

[56] References Cited
U.S. PATENT DOCUMENTS

| 1,794,831 | 3/1931 | Caruso | 29/831 |
| 3,059,320 | 10/1962 | Seabury et al. | 29/831 |
| 4,264,397 | 4/1981 | Kawashima | 156/361 |
| 4,482,874 | 11/1984 | Rubertus et al. | 156/267 |
| 4,555,291 | 11/1985 | Tait et al. | 156/267 |
| 4,701,236 | 10/1987 | Vieilledent | 156/252 |
| 4,835,846 | 6/1982 | Juan et al. | 361/398 |

FOREIGN PATENT DOCUMENTS

| 265548 | 2/1965 | Australia . |
| 0201952 | 11/1986 | European Pat. Off. . |
| 1156131 | 10/1963 | Fed. Rep. of Germany . |
| 2412225 | 9/1980 | France . |
| 608314 | 12/1978 | Switzerland . |
| 2031796 | 4/1980 | United Kingdom . |

OTHER PUBLICATIONS

International Search Report of International Application No. PCT/CH88/00102.

Primary Examiner—Caleb Weston
Attorney, Agent, or Firm—Pollock, Vande Sande & Priddy

[57] ABSTRACT

The invention concerns a method of mass producing a tape intended to provide electrical circuits, the tape constituting an intermediate step in the production of electronic modules. The method comprises providing a metal strip (1) having openings defining a series of similar networks of conductors, each conductors being connected to the strip (1) by a bridge, and providing insulating sheets (18) having holes (19, ... 27) and sticking these sheets to the metal strip in such a manner that the holes face the conductors. The thus-assembled strip (1) and sheets (18) constitute the tape, while the conductors with a part of the sheets define the circuits of the modules.

18 Claims, 5 Drawing Sheets

METHOD OF PRODUCING A TAPE FOR PROVIDING ELECTRONIC MODULES, AND TAPE OBTAINED BY THIS METHOD

RELATED APPLICATIONS

This application corresponds to International Application No. PCT/CH88/00102, which was filed June 6, 1988, and designed the United States.

TECHNICAL FIELD

The present invention, which relates to flexible, thin electronic modules, concerns a method of mass producing circuits for such modules, each circuit comprising an insulating substrate and a pattern of thin conductors disposed on one surface of the substrate. At least one electronic component is furthermore placed on one surface of the circuit and connected to the conductors, the component and the circuit forming the module. The invention more particularly concerns a method of mass producing a tape, as an intermediate product, intended to provide a multiplicity of circuits for modules, as well as the tape obtained by this method.

BACKGROUND OF THE INVENTION

Such modules are well known and, in view of their small thickness and their flexibility, they are principally intended to form part of small-sized products. Amongst these products should, in particular, be noted: electronic cards also called "smart cards", such as credit cards, parking cards, telephone call cards etc., as well as electronic watch movements.

A method of mass producing electronic-timepiece modules, having a thin circuit and electronic components, is for example described in detail in French patent FR 2 412 225. This method consists essentially in providing an insulating tape-like film by way of substrate, sticking onto this film a thin metal strip, forming the patterns of conductors by photolithography and in so doing eliminating the non-usable part of the strip whereby the substrate and conductors define the circuits, connecting the electronic components to these conductors, and finally separating the thus-obtained modules from their support-serving film by stamping.

This manner of proceeding however has several drawbacks. Firstly, the processing of the metal tape by photolithography apart from being long and expensive involves chemically etching the metal with a solvent which by producing ionic pollution of the insulating film reduces the long-term reliability of the modules. Secondly, due to the fact that photolithographic processing forms electrically insulated conductors, if the modules include an electronic component such as an integrated circuit sensitive to electrical discharges the modules will also be very sensitive to such discharges in the final stages of their manufacture, or during storage.

Another method of mass producing circuits for modules having the advantage of not requiring etching is described in Swiss Patent CH 608 314. It consists in providing an insulating film, also in tape form, and sticking on this film a metal strip in which the conductors have been pre-cut by stamping, each conductor remaining connected to the rest of the strip by one of its ends. However, simultaneously with the sticking operation, the conductors are also cut from the strip. Hence this method, like the previous one, produces circuits with insulated conductors and therefore modules that are not protected against electric shocks.

The methods known from the prior art therefore have the drawback of including a step of removing all excess metal from the strip, leaving on the substrate of the circuits only conductors in their final form and which therefore are electrically insulated.

DISCLOSURE OF THE INVENTION

An object of the invention is to propose a method of mass producing a tape intended to provide circuits for modules, which does not suffer from this drawback.

To achieve this object, the mass-production method according to the invention is distinguished in that it comprises:

providing a metal strip having a series of openings going right through the strip, these openings defining the patterns of conductors of the circuits in such a manner that each conductor remains connected to the tape by a bridge;

providing a plurality of insulating sheets, which sheets are intended to form the substrate for the circuits; and sticking each sheet onto one face of the strip by means of an adhesive in such a manner that each pattern of conductors forms, with at least one part of the sheet, a circuit whereas the strip and the sheets form the tape.

One advantage of the method according to the invention is to provide a tape that has, on one surface, conductors remaining galvanically connected to the metal strip.

Another object of the invention is the tape obtained according to the present method.

BRIEF DESCRIPTION OF THE DRAWINGS

Other characteristics and advantages of the present invention will appear from the following description, made with reference to the accompanying drawings and giving, by way of non-limiting example, an example of the method of mass producing such a tape intended to supply circuits for electronic modules. In these drawings, where the same references designate like elements.

DESCRIPTION OF THE PREFERRED EMBODIMENTS

The present invention will be described taking as example the mass production of complete electronic modules for credit cards, each module having in this instance a single electronic component. This production method includes an important intermediate step which consists in producing a tape intended to supply circuits for the modules, this step constituting the invention as such. Of course the tape thus obtained may be used advantageously in numerous other fields, in particular for producing modules of electronic watches.

To obtain the tape by the method according to the invention, and then the electronic modules, it is first necessary to provide a thin metal strip. This strip, whose thickness is typically 75 micrometers but may vary between 50 and 150 micrometers, is advantageously made of nickel or ARCAP trademark of french company Le Comptoir Lyon, Alemand, Louyot of Boite Postale 3, F-60540 Burnel, France, for a proprietary (alloy of copper, nickel and zinc).

Figure 1:
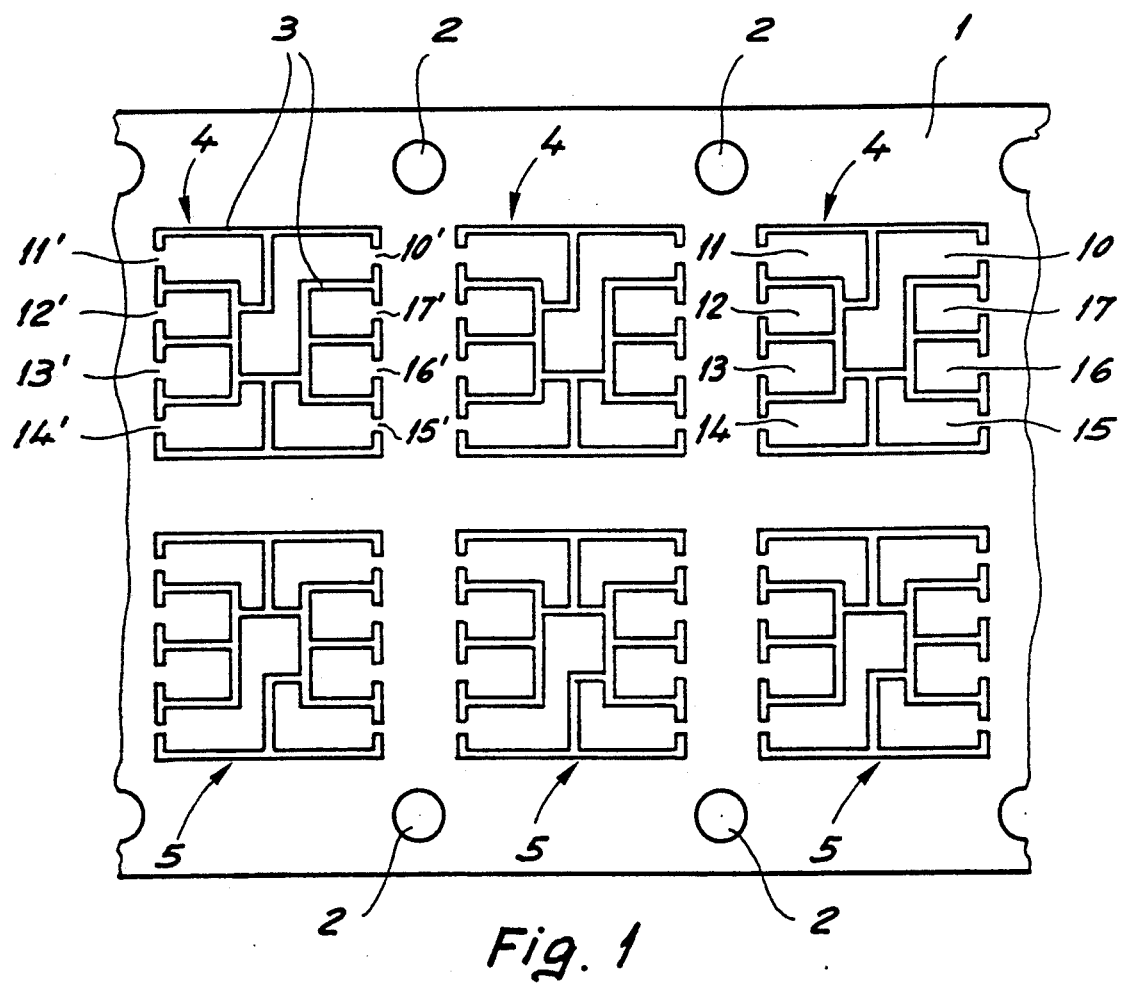
FIG. 1 shows part of a thin metal strip provided with a series of openings delimiting the conductors of circuits for electronic modules to be incorporated in credit cards.

Such a strip, designated by reference 1, is shown in FIG. 1. The length of the strip is undefined whereas it width is typically 35 mm. To facilitate it being driven in automatic conveying machines, the strip may be provided with lateral perforations 2.

The strip 1 has a series of openings designated by reference 3. These openings may advantageously be produced by stamping, as this machining operation is clean, fast and economical. However, if the fineness or the complexity of the openings does not allow them to be produced by stamping, there is no disadvantage in using a photolithographic method as any traces of pollution of the metal surfaces can easily be removed by cleaning at the end of this operation.

The openings 3 are distributed on the metal strip 1 in a manner such as to form a succession of identical groups 4 arranged longitudinally of the strip. The width of the strip shown in FIG. 1 furthermore enables a second succession of groups, designated by reference 5, to be arranged parallel to the succession of groups 4.

Each group 4 of openings 3 defines a pattern of conductors, which conductors serve to connect the electronic component of each module to external terminals or to contact areas. In the example shown in FIG. 1, one pattern has 8 conductors designated by references 10 to 17, each conductor remaining connected to the strip by a bridge so as to support it, these bridges being designated by references 10' to 17'. In FIG. 1, the bridges are narrower than the conductors from which they extend in order to better define them but, of course, the bridges and conductors could have the same transverse dimension. In the case of more complex patterns, a conductor could quite well occupy a central position making it impossible for it to be connected directly to the remainder of the metal strip 1. A bridge should then be set up between this conductor and a neighbouring conductor for which connection with the strip is feasible.

Figure 2:
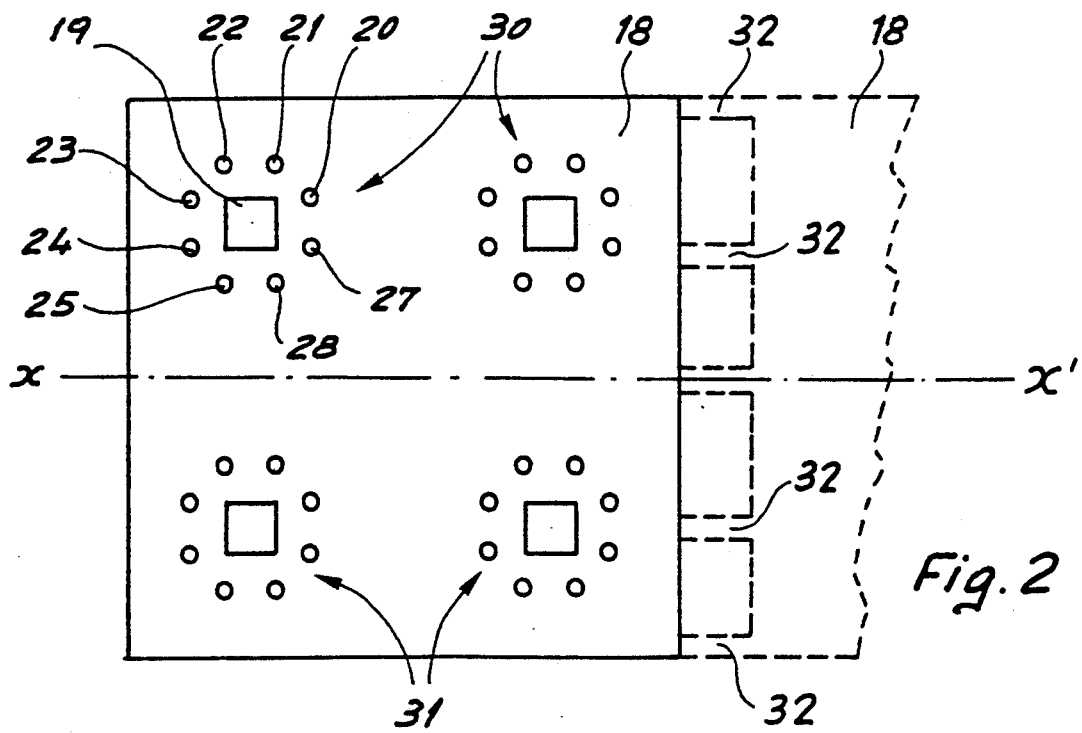
FIG. 2 shows an insulating sheet having holes for the connection of four integrated circuits for credit cards.
Figure 3:
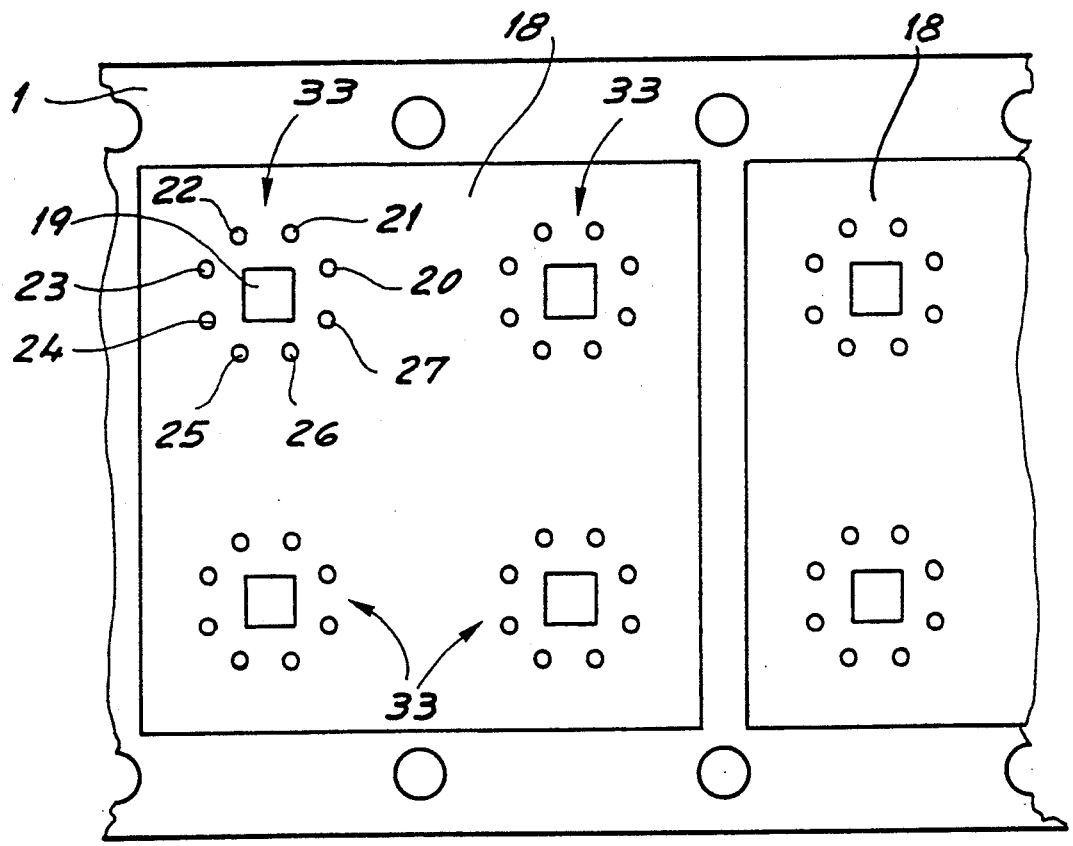
FIG. 3 is a view showing the insulating sheet stuck to the metal strip, together forming a part of the tape according to the invention, which part includes four circuits.

Next, it is necessary to provide an insulating sheet, designated by reference 18 in FIG. 2, comprising a series of holes 19, 20, . . . 27 and having one surface covered with a layer of adhesive material. The sheet may advantageously be a fiberglass fabric or KAPTON typically 125 micrometers thick, carrying on one surface a thermoplastics material or a thermosetting material enabling it to be heat bonded. KAPTON is the trademark of the Du Pont de Nemours Company for a proprietary product made of polyimides. The thermoplastics and thermosetting materials may be of the types known under the name "Hot melt" for the former and "B-Stage epoxy" for the latter. The holes, for example produced by stamping, are arranged on the sheet in a manner such as to form a succession of identical groups 30. In each group, the arrangement of holes corresponds to the arrangement of the connections that should connect the terminals of the electronic component to the conductors. In this example, the sheet 18a is square shaped and, for reasons which will be apparent from the following description, has only two groups 30 arranged parallel with an axis xx' considered arbitrarily as being the longitudinal axis of the sheet. Two other groups, designated by reference 31, are also arranged on the sheet parallel with the groups 30. The sheet 18, which thus has four groups of holes, is placed, by its surface that is covered with the adhesive layer, over one surface of the metal strip 1 in such a manner that each group 30, 31 of holes 19, . . . 27 comes to face a pattern of conductors 10, . . . 17. After this sheet, another sheet, identical to the first, is placed over the strip as shown in FIG. 3. The sheets are then stuck on the strip. This is achieved by heating the sheets while pressing them against this strip. The heating however produces some retraction of the insulating material, which retraction makes it difficult to use larger sheets, especially in the longitudinal direction. Of course with cold bonding there would be no retraction problem and longer sheets could be used. However, their adherence to the metal would not be so good.

The insulating sheets 18 may advantageously be connected end-to-end by bridges 32, shown in FIG. 2, whereby these sheets form a continuous insulating strip, similar to the metal strip 1, that is easier to manipulate than individual sheets. The length of the bridges 32 is however greater than the distance separating two adjacent sheets on the metal strip 1 so as to enable each sheet to be precisely positioned by its edges, by its holes 19, 20, . . . 27, or by means of other perforations (not shown) provided for this purpose.

The thus-united metal strip 1 and sheets 18 form a continuous tape, which constitutes another aspect of the invention. This tape, partly shown in FIG. 3, in this example is 200 micrometers thick and includes a series of identical circuits designated by references 33, each circuit allowing one electronic circuit to be obtained.

Figure 4:
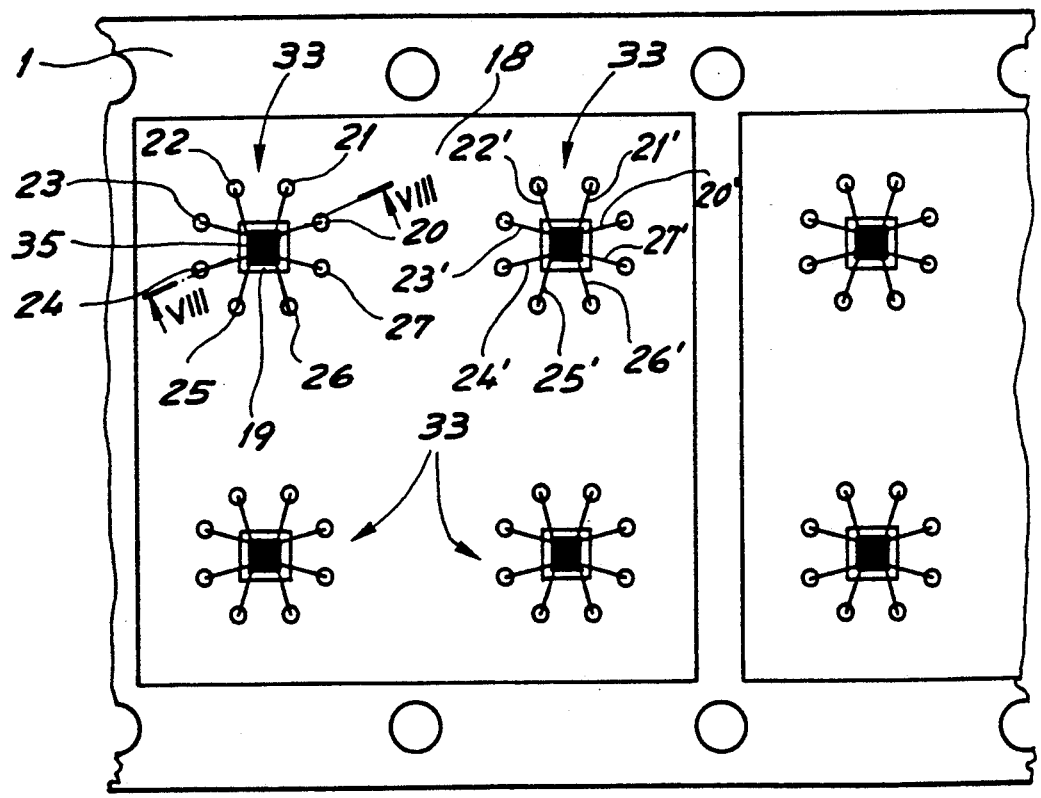
FIG. 4 shows the circuits illustrated in FIG. 3 on which four integrated circuits are arranged to constitute four electronic modules.
Figure 8:
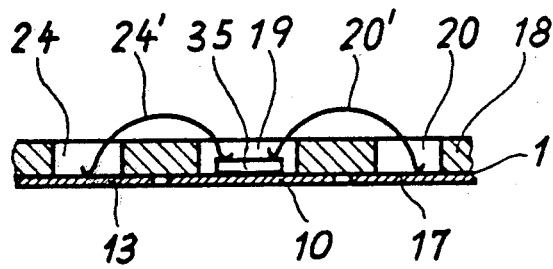
FIG. 8 is a partial view in cross-section along line VIII—VIII of one of the modules shown in FIG. 4.

The module could be made by connecting one electronic component to the circuit after this has been detached from the tape. It is however more advantageous to keep the tape intact and place the electronic component on the insulating face of each circuit 33, i.e. on the side of the sheet 18 as shown in plan in FIG. 4 and in cross-section along line VIII—VIII in FIG. 8. This component, which in this example is an integrated circuit designated by reference 35, is placed in the central hole 19 of the sheet and fixed by soldering or by means of an adhesive onto the conductor 10. The terminals of the integrated circuit are connected, using the wire bonding technique, to the conductors 10, 11, . . . 17 by wires 20',21', . . . 27' which pass respectively through holes 20, 21, . . . 27 of the sheet. To avoid any damage to the module, the integrated circuit and the wires are further covered with a layer of opaque resin indicated by numeral 36 in FIG. 5.

Figure 5:
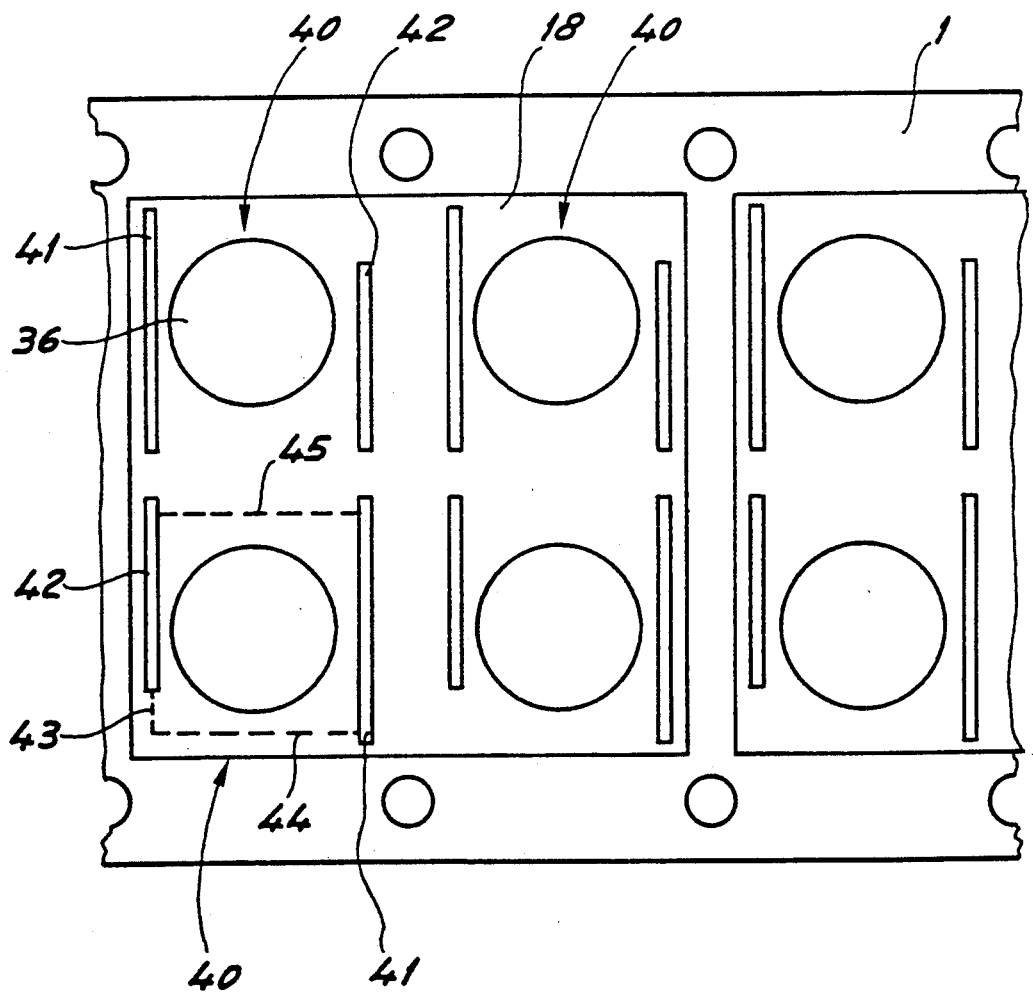
FIG. 5 shows the electronic modules in their final configuration with the integrated circuits protected by a resin, each module being pre-cut but remaining solid with the metal strip.

At this point in the production, as shown in FIG. 5 the tape has two parallel rows of electronic modules, each module, designated by reference 40, remaining connected to the metal tape by bridges 10', 11', ... 17', as well as by the sheet 18. As the conductors 10, 11, ... 17 are short-circuited, the modules are protected against static electrical discharges.

It is still possible to electrically test the module 40, without detaching it from the strip 1, by making two openings, designated by references 41 and 42 in FIG. 5, so as to cut all of the bridges except bridge 10' which, in the present case, corresponds to the conductor that is directly connected to the integrated circuit's earth. Signals are then applied to and measured on the conductors from the surface of the circuit where they are not covered by the insulating sheet 18. Of course, the modules are consequently no longer protected against electric shocks.

When the tests are finished, the module 40 is separated from the metal strip 1 by cutting the last bridge 10' along line 43, and the remainder of the sheet 18 along lines 44 and 45.

Once the module is detached, it is placed in a credit card in such a manner that the surface of the circuit opposite that carrying component 35 is flush with a surface of the card so that a part at least of the conductors is accessible from outside. This part of the conductors thus defines contact areas for the electrodes of the various apparatus into which the card is intended to be introduced.

The production method which has just been described taking as example an electronic module for a credit card could, of course, be used to make modules intended for other applications, in particular in the horological field.

Figure 6:
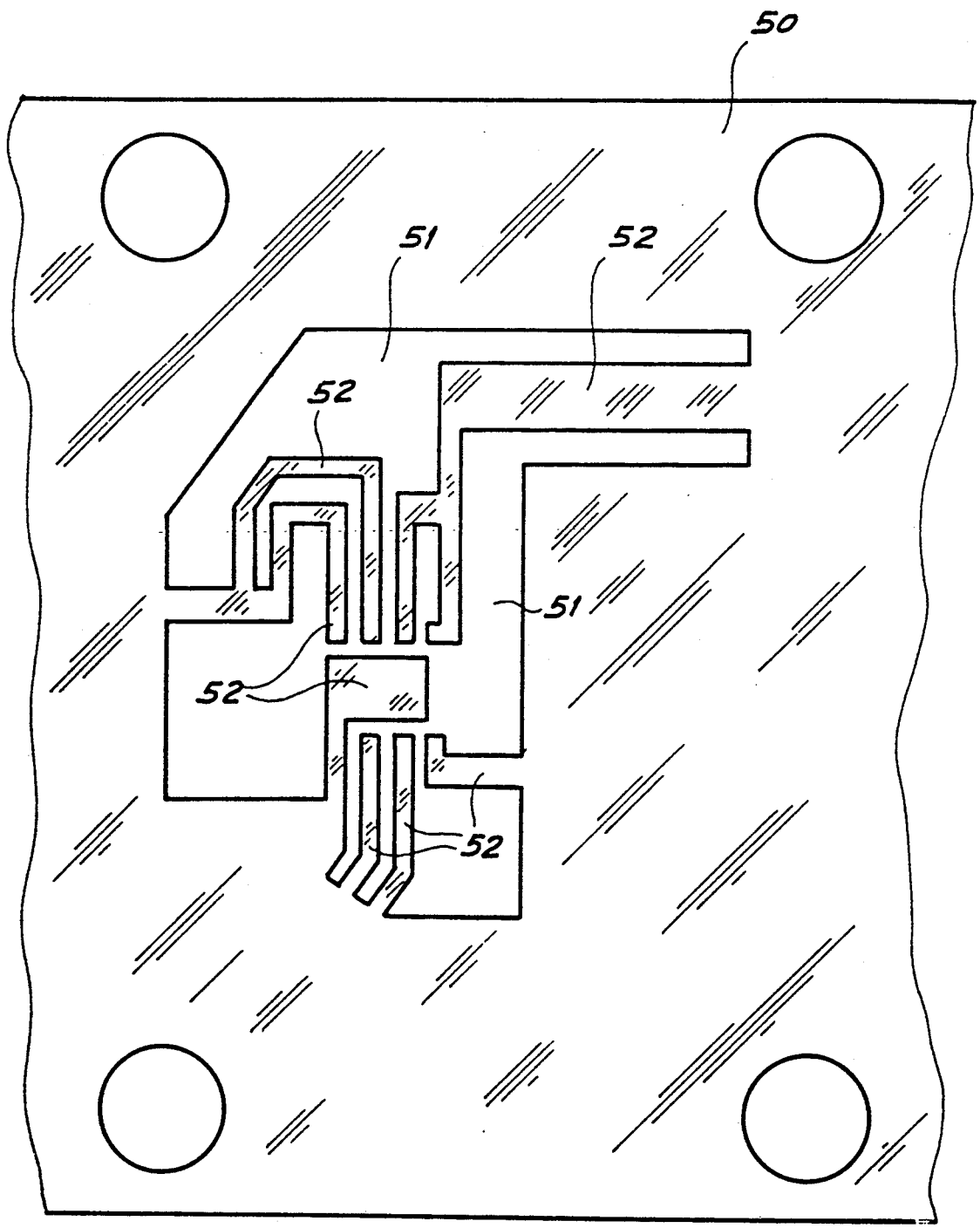
FIG. 6 is a partial view of a metal strip having openings delimiting the conductors of a module for incorporation in an analogue watch.

FIG. 6 thus shows a part of a metal strip 50 having a group of openings 51 defining in this strip a pattern of conductors 52 for an analogue electronic watch module, each conductor remaining connected to the tape by a bridge. The intermediate production steps of such modules will not be described in detail as they are identical to those described in relation to the credit card modules; they in particular comprise the steps for producing a tape intended to provide the circuits for these modules.

Figure 9:
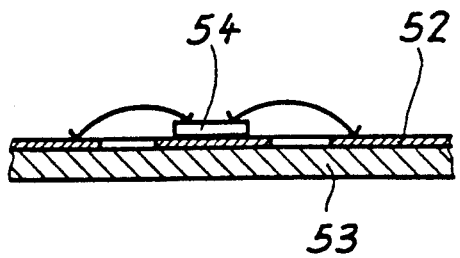
FIG. 9 is a partial view in cross-section along line IX—IX of the module for a watch shown in FIG. 7.
Figure 7:
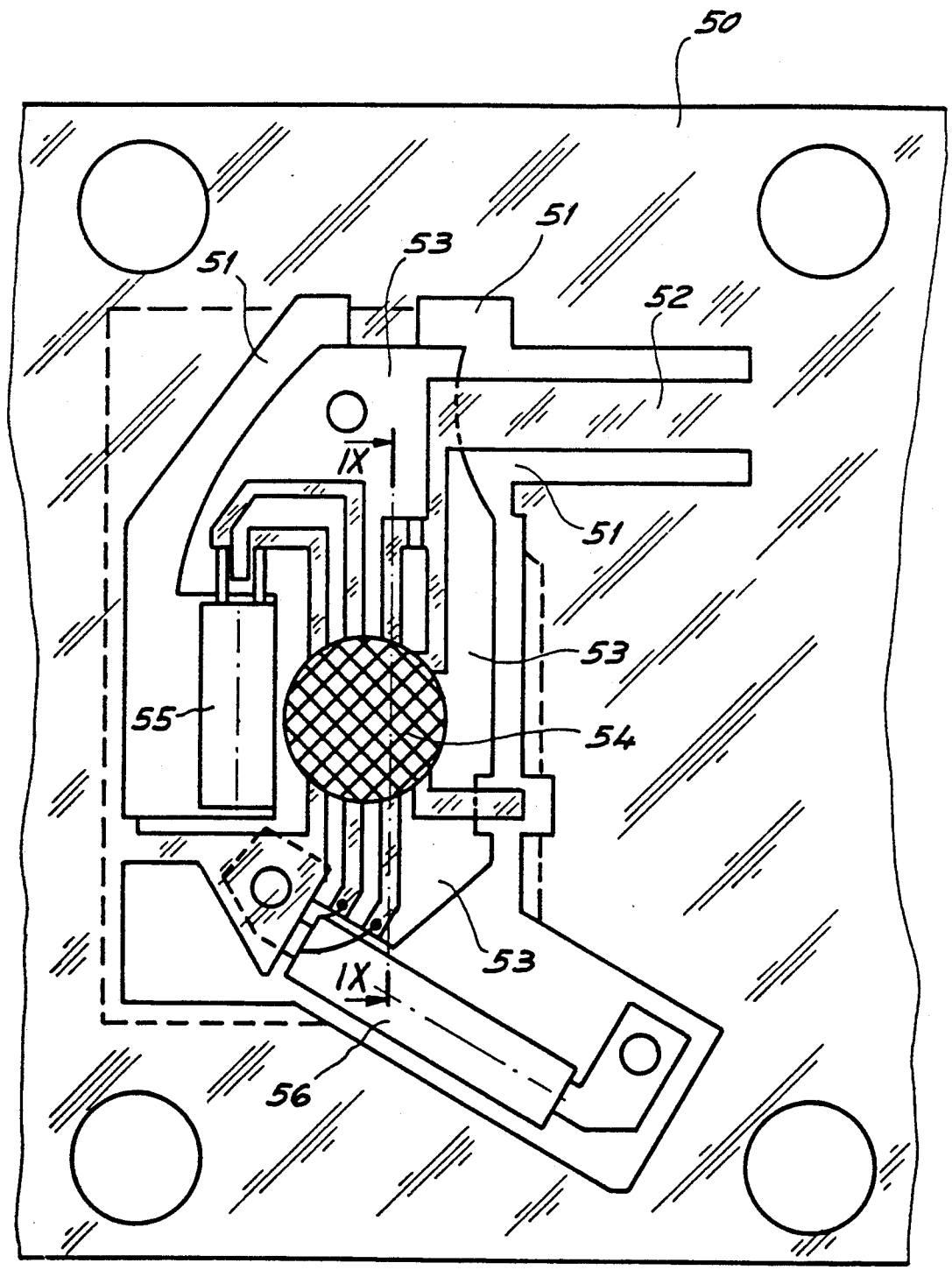
FIG. 7 shows this module for a watch and its different component elements.

A finished watch module, but still connected to the metal strip 50, is shown in plan view in FIG. 7 with the surface of the circuit carrying the conductors on top. This module comprises an integrated circuit 54 coated with an opaque protective layer, a quartz resonator 55, and a coil 56 of a stepping motor. Unlike the preceding module, these electronic components are arranged on the surface of the circuit on which the conductors 52 are located. FIG. 9 shows this arrangement in cross-sectional view along line IX—IX of FIG. 7, the circuit being shown without its protective layer. It is obvious that if so required by the complexity of the circuit, the components could be arranged on both surfaces of the circuit, the sheet 53 then having holes by means of which connections can be established between the conductors and the components arranged on the insulating surface of the circuit.

Electrical connections between the integrated circuit and the conductors are obtained, as before, by means of thin wires using again the so-called "wire bonding" technique but other known connecting techniques could be used. Thus, in this module the terminals of the quartz resonator and the coil's wires are directly soldered to the corresponding conductors. To improve the module's reliability, other components, except for the integrated circuit, may also be protected by a layer of insulating material.

Of course, the present invention covers any modification obvious to the person skilled in the art and which could be made to the just-described method of producing the strip for providing electronic module circuits.

What is claimed is:

1. A method of mass producing a tape for providing a plurality of electronic modules, each module including an insulating substrate, a pattern of conductors for forming a circuit, and at least one electronic component having a plurality of terminals, said method comprising:
   providing a thin continuous metal strip having a series of openings going right through the strip, these openings defining patterns of conductors for a plurality of said circuits, each conductor being connected to the strip by a bridge;
   providing a plurality of insulating sheets each for providing one of said substrates;
   sticking each sheet onto one face of the metal strip by means of an adhesive to form the substrate for a corresponding one of said patterns;
   providing a plurality of electronic components and placing at least one of said electronic components on at least one of the conductors of each of said patterns; and,
   connecting the terminals of each of said electronic components with at least some of the conductors of its corresponding pattern so as to form a tape supporting a plurality of electronic modules, each conductor of which remains galvanically connected to the metal strip by means of its corresponding bridge so that said terminals are short-circuited to protect said electronic components against static electrical discharges during storage or handling of the tape.

2. A mass-production method according to claim 1, wherein the openings in the metal strip are produced by stamping.

3. A mass-production method according to claim 1 wherein said adhesive material is applied to one surface of each of said sheets.

4. A mass-production method according to claim 1 wherein said adhesive material is a thermoplastics material, and wherein the sticking together is obtained by hot pressing the sheet against the strip.

5. A mass-production method according to claim 1 wherein said adhesive material is a thermosettable material, and wherein the sticking together is obtained by hot pressing the sheet against the strip.

6. A mass-production method according to claim 1 wherein said strip is made of nickel.

7. A mass-production method according to claim 1 wherein said insulating sheets are connected together at opposite edges by at least one flexible connection member, and wherein said method further comprises separating said sheets before said sheets are stuck onto said one face of the metal strip.

8. A mass-production method according to claim 1 wherein said sheets are glass-fibre sheets.

9. A mass-production method according to claim 1 wherein the electronic components are placed on the face of the metal strip opposite to the face of the metal strip onto which the insulating sheets are stuck.

10. A mass-production method according to claim 1 wherein each of said sheets is provided with a plurality of holes, and wherein said method further comprises positioning each sheet on the metal strip so that each of at least some of the holes face a corresponding one of at least some of the conductors in order to allow said component, when placed on the same side of the metal strip as the sheet, to be connected to each of said conductors faced by one of said holes.

11. A mass-production method according to claim 1 further comprising the step of covering said electronic components and the connections thereof with said conductors with a protective layer of resin.

12. A mass-production method according to claim 1 further comprising the step of providing openings passing through said metal strip and said insulating sheets so as to cut all of said bridges except those of the conductors on which the electronic components are placed.

13. A tape for providing a plurality of electronic modules, each module including an insulating substrate, a pattern of conductors for forming a circuit, and at least one electronic component having a plurality of terminals, said tape comprising:
- a thin and continuous metal strip having a series of openings passing right through the strip, these openings defining patterns of conductors for a plurality of said circuits, each conductor being connected to the strip by a bridge;
- a plurality of insulating sheets stuck onto one face of said metal strip, each of said insulating sheets forming the substrate for a corresponding one of said patterns; and,
- a plurality of electronic components, at least one of said electronic components being fixed in place on at least one of the conductors of each of said patterns, the terminals of each of said electronic components being connected to at least some of the conductors of its corresponding pattern such that the tape supports a plurality of electronic modules, each conductor of which remains galvanically connected to the metal strip by means of its corresponding bridge so that said terminals are short-circuited to protect said electronic components against static electrical discharges during storage or handling of the tape.

14. A tape according to claim 13 wherein each of said insulating sheets is separated from adjacent ones of said sheets.

15. A tape according to claim 13 wherein each of the electronic components is fixed in place on the face of the metal strip opposite to the face of the metal strip onto which the insulating sheets are stuck.

16. A tape according to claim 13 wherein one of the terminals of the electronic component of each module is connected to the conductor on which the component is fixed.

17. A tape according to claim 16 wherein the conductor on which the electronic component is fixed corresponds to the earth conductor of the electronic module.

18. A tape according to claim 13 wherein each of said sheets has a plurality of holes, each of at least some of said holes facing a corresponding one of at least some of the conductors connected to the corresponding electronic component.

* * * * *